(12) United States Patent  
Lee et al.

(10) Patent No.: US 9,324,968 B2
(45) Date of Patent: Apr. 26, 2016

(54) METHOD OF MANUFACTURING AN ORGANIC LIGHT EMITTING DISPLAY DEVICE

(71) Applicant: Samsung Display Co., Ltd., Yongin (KR)

(72) Inventors: Keun Soo Lee, Cheonan-si (KR); Young Gu Kim, Hwaseong-si (KR); Hyun Jun Cho, Hwaseong-si (KR); Young Ji Kim, Hwaseong-si (KR); Jeong Yong Eom, Icheon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 58 days.

(21) Appl. No.: 14/091,821

(22) Filed: Nov. 27, 2013

(65) Prior Publication Data
US 2015/0079707 A1  Mar. 19, 2015

(30) Foreign Application Priority Data

Sep. 13, 2013  (KR) .................. 10-2013-0110702

(51) Int. Cl.
*H01L 51/52* (2006.01)
*H01L 27/32* (2006.01)
*H01L 51/00* (2006.01)
*H01L 51/56* (2006.01)

(52) U.S. Cl.
CPC ........ *H01L 51/5253* (2013.01); *H01L 27/3223* (2013.01); *H01L 51/5237* (2013.01); *H01L 51/5246* (2013.01); *H01L 51/5256* (2013.01); *H01L 51/0097* (2013.01); *H01L 51/56* (2013.01); *H01L 2251/5338* (2013.01); *H01L 2251/556* (2013.01); *H01L 2251/558* (2013.01)

(58) Field of Classification Search
None
See application file for complete search history.

(56) References Cited

U.S. PATENT DOCUMENTS

| | | | | |
|---|---|---|---|---|
| 6,268,695 B1* | 7/2001 | Affinito | .............. | H01L 51/5237 313/504 |
| 8,309,379 B2* | 11/2012 | Park | .................... | H01L 27/1266 257/E21.7 |
| 2010/0308335 A1* | 12/2010 | Kim | .................... | H01L 27/3244 257/59 |
| 2014/0021856 A1* | 1/2014 | Jung | .................. | H01L 51/5253 313/504 |
| 2014/0091288 A1* | 4/2014 | Lee | .................... | H01L 51/5256 257/40 |

FOREIGN PATENT DOCUMENTS

| | | |
|---|---|---|
| KR | 10-2010-0009836 | 1/2010 |
| KR | 10-2010-0130898 | 12/2010 |

* cited by examiner

*Primary Examiner* — Andres Munoz
(74) *Attorney, Agent, or Firm* — H.C. Park & Associates, PLC

(57) ABSTRACT

A manufacturing method of an organic light emitting diode (OLED) display is disclosed. The manufacturing method in accordance with an exemplary embodiment includes: preparing a flexible substrate and a display panel including a thin film encapsulation (TFE) layer for covering and protecting an OLED formed on the flexible substrate; attaching a first protection film to the TFE layer by using a first adhesive to be opposite to the TFE layer; heating a second protection film; and pressing and attaching a second protection film onto the flexible substrate by using a second adhesive.

12 Claims, 16 Drawing Sheets

~101

METHOD OF MANUFACTURING AN ORGANIC LIGHT EMITTING DISPLAY DEVICE

CROSS REFERENCE TO RELATED APPLICATION

This application claims priority to and the benefit of Korean Patent Application No. 10-2013-0110702, filed on Sep. 13, 2013, which is hereby incorporated by reference for all purposes as if fully set forth herein.

BACKGROUND

1. Field

Exemplary embodiments of the present invention relate to a manufacturing method for an organic light emitting diode (OLED) display. More particularly, exemplary embodiments relate to an OLED display having a curling-improved structure.

2. Discussion of the Background

Organic light emitting diode displays include organic light emitting elements that include a hole injection electrode, an organic emission layer, and an electron injection electrode. Each organic light emitting element emits light by energy generated when an exciton, generated by combining an electron and a hole in the organic emission layer, falls from an exited state to a ground state. Thus, the organic light emitting diode display displays a predetermined image by using this light emission.

In contrast to liquid crystal displays, organic light emitting diode displays have a self-luminance characteristic so a separate light source is not required. Thus, thickness and weight of the display may be reduced. Further, since organic light emitting diode displays exhibit desirable characteristics such as low power consumption, high luminance, and rapid response speed, organic light emitting diode displays are receiving attention as a next generation display device.

The organic light emitting diode (OLED) display has a panel structure in which a driving circuit unit and the organic light emitting element formed on a flexible substrate are protected by a thin film encapsulation (TFE) layer. In a process of forming the TFE layer, chemical vapor deposition (CVD) is used. However, when CVD is used, a flexible panel is greatly stressed by a strong compression characteristic of $SiN_x$, so the panel may be bent. In addition, due to the bending characteristic (flexibility) of the flexible panel, when the force (tension or compression force) of the internal layers is not balanced, curling in one direction is generated.

In conventional display devices, upper and lower protection films are attached to flexible display panels. Since the upper protection film is designed to be removed later, an adhesive for the upper protection film is typically formed of silicon having low adhesion. In contrast, the lower protection film needs to be permanently attached, and thus, an adhesive for the lower protection film is typically formed of an acryl having high adhesion. However, the lower modulus of silicon compared to acryl when both the upper and lower protection films are attached to the flexible display panel generates curling toward the upper side of the upper protection film.

Such curling makes it difficult to perform various subsequent processes, such as vacuum adsorption, align key recognition, transport, and loading.

The above information disclosed in this Background section is only for enhancement of understanding of the background of the described technology and therefore it may contain information that does not form the prior art that is already known in this country to a person of ordinary skill in the art.

BRIEF SUMMARY OF THE INVENTION

Embodiments of the present invention provide a manufacturing method of an organic light emitting diode (OLED) display, having advantages of allowing adhesives of an upper protection film and a lower protection film of a display panel to have the same elongation. Embodiments include heating the upper and lower protection films before attaching them to the display panel, thereby preventing curling of the display panel.

An exemplary embodiment provides a manufacturing method of an OLED display, including: preparing a flexible substrate and a display panel including a thin film encapsulation (TFE) layer for covering and protecting an OLED formed on the flexible substrate; attaching a first protection film onto the TFE layer by using a first adhesive to be opposite to the TFE layer; heating a second protection film; and pressing and attaching a second protection film onto the flexible substrate by using a second adhesive.

In accordance with the exemplary embodiments, it is possible to reduce curling of the OLED display by heating the protection films to be attached to the display panel.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
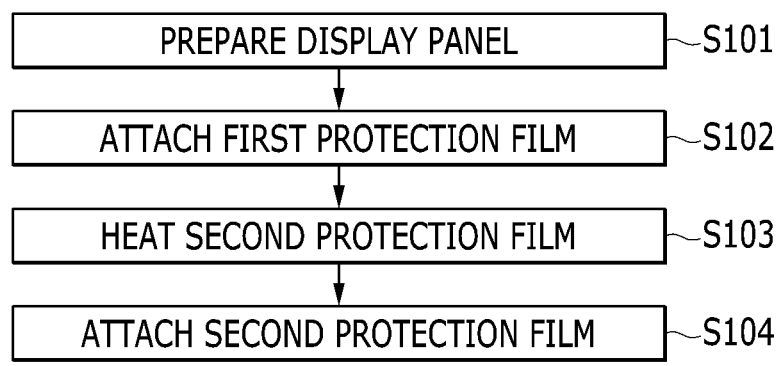
FIG. 1 is a flowchart showing a manufacturing method of an organic light emitting diode (OLED) display in accordance with a first exemplary embodiment.

Hereinafter, exemplary embodiments will be described in detail with reference to the attached drawings such that the present invention can be easily put into practice by those skilled in the art. As those skilled in the art would realize, the described embodiments may be modified in various different ways, all without departing from the spirit or scope of the present invention.

In addition, in various exemplary embodiments, the same constituent elements are denoted by the same reference numerals and are representatively described in an exemplary embodiment, and different elements from the elements of the exemplary embodiment are described in other exemplary embodiments.

The drawings are schematic and are not illustrated in accordance with a scale. The relative sizes and ratios of the parts in the drawings are exaggerated or reduced for clarity and convenience in the drawings, and the arbitrary sizes are only exemplary and are not limiting. The same structures, elements, or parts illustrated in no less than two drawings are denoted by the same reference numerals in order to represent similar characteristics. When a part is referred to as being "on" another part, it can be directly on the other part or intervening parts may also be present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Exemplary embodiments are illustrated in detail. As a result, various modifications are expected to be made. Therefore, the exemplary embodiments are not limited to a specific shape of an illustrated region, but, for example, include changes in shape in accordance with manufacturing.

A manufacturing method of an organic light emitting diode (OLED) display in accordance with a first exemplary embodiment will now be described with reference to FIG. 1 to FIG. 2E.

FIG. 1 is a flowchart showing a manufacturing method of an organic light emitting diode (OLED) display in accordance with a first exemplary embodiment, and FIG. 2A to FIG. 2E are stepwise cross-sectional views schematically showing the manufacturing method of the first exemplary embodiment.

Figure 2A:
FIG. 2A to FIG. 2E are stepwise cross-sectional views schematically showing the manufacturing method of FIG. 1.
Figure 2B:
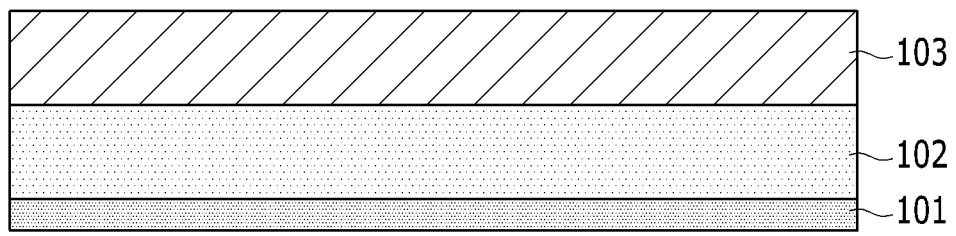
Figure 2C:
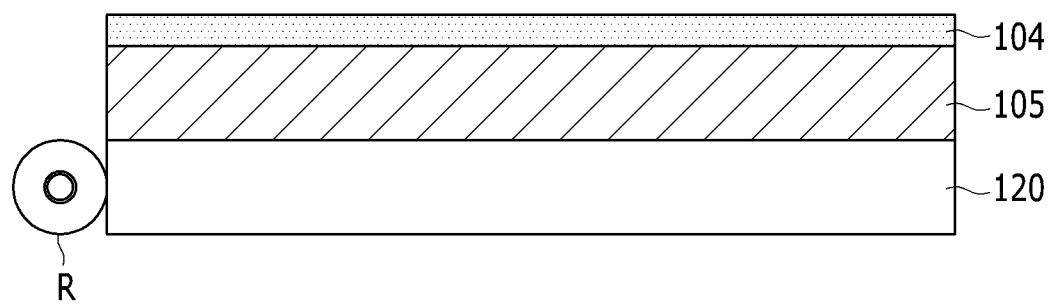
Figure 2D:
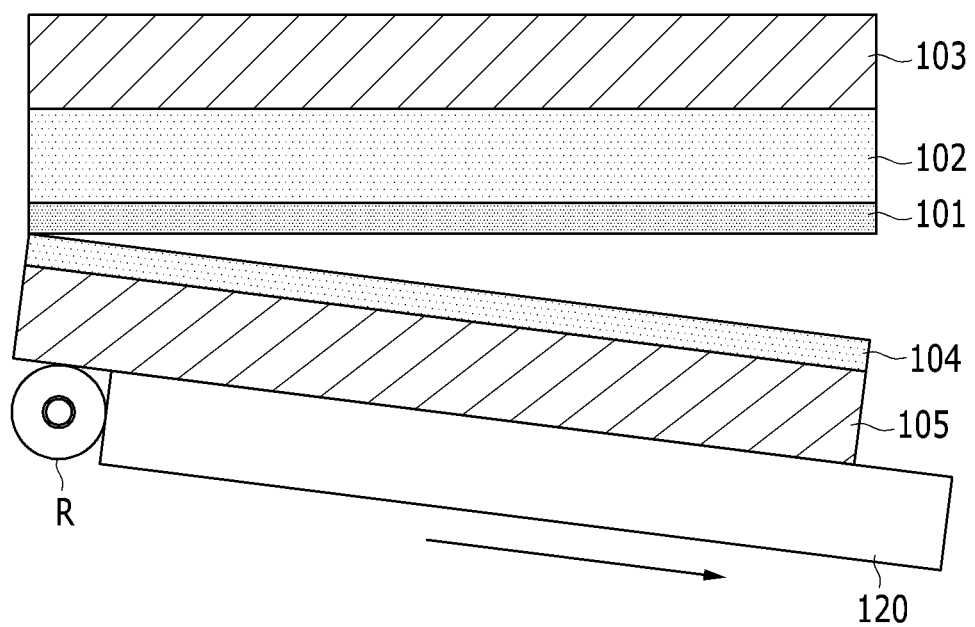
Figure 2E:
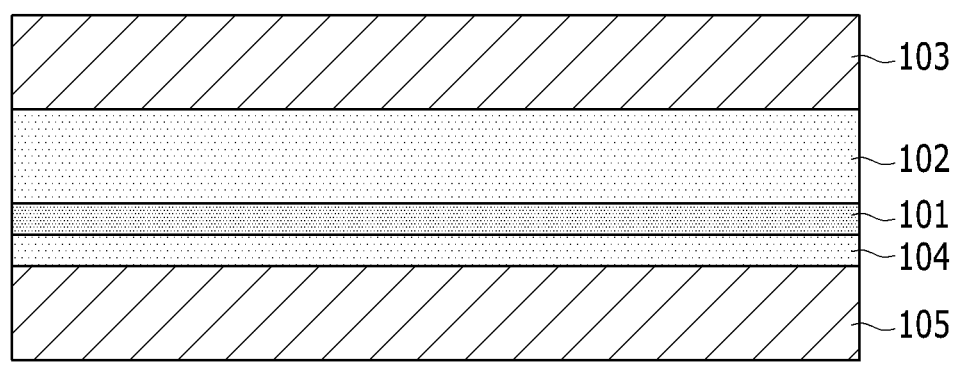

Referring to FIG. 1 to FIG. 2E, a flexible substrate and a display panel 101, including a thin film encapsulation (TFE) layer for encapsulating and protecting an OLED formed on the flexible substrate, are prepared (S101). The display panel 101 includes a driving circuit formed on the flexible substrate and the thin film encapsulation layer. The flexible substrate may be made of a flexible material, such as a flexible plastic material. In another embodiment, the flexible substrate may be formed, for example, of a metallic substrate made of stainless steel, but other various flexible materials are usable. For example, the flexible substrate may be made of a plastic having excellent thermal resistance and durability such as polyethylene ether phthalate, polyethylene naphthalate, polycarbonate, polyarylate, polyetherimide, polyether sulfone, and polyimide.

The driving circuit drives the OLED and includes a thin film transistor. The OLED is connected to the driving circuit and emits light according to a driving signal transmitted from the driving circuit to display an image. The OLED and the driving circuit may be formed with various configurations within a range that can be easily modified or realized by a person skilled in the art.

The TFE layer may be formed on the flexible substrate of the display panel 101 to encapsulate and protect the OLED and the driving circuit, by alternately stacking at least one organic layer and at least one inorganic layer. There may be multiple inorganic layers and/or organic layers.

The organic layer may be formed with polymers, and it may be a single layer or a deposition layer including one of polyethylene terephthalate, a polyimide, a polycarbonate, an epoxy, polyethylene, and a polyacrylate. More specifically, the organic layer may be formed with a polyacrylate that may include a polymerized monomer composition including a di-acrylate monomer and a tri-acrylate monomer. A monoacrylate monomer may be included in the monomer composition. Additionally, a photoinitiator such as TPO (2,4,6-trimethylbenzoyl diphenyl phosphine oxide) may be further included in the monomer composition, but is not limited thereto.

The inorganic layer may be a single layer or a deposition layer including a metal oxide or a metal nitride. More specifically, the inorganic layer may include one of $SiN_x$, $Al_2O_3$, $SiO_2$, and $TiO_2$.

The uppermost layer of layers constituting the TFE layer, which is exposed to the outside, may be formed of an inorganic layer in order to prevent permeation of moisture to the OLED.

The TFE layer may include at least one sandwich structure in which at least one organic layer is inserted between at least two inorganic layers. Further, the TFE layer may include at least one sandwich structure in which at least one inorganic layer is inserted between at least two organic layers.

The TFE layer may include an OLED layer, a first inorganic layer, a first organic layer, and a second inorganic layer, sequentially from the bottom. Alternatively, the TFE layer may include an OLED layer, a first inorganic layer, a first organic layer, a second inorganic layer, a second organic layer, and a third inorganic layer, sequentially from the bottom. Alternatively, the TFE layer may include an OLED layer, a first inorganic layer, a first organic layer, a second inorganic layer, a second organic layer, a third inorganic layer, a third organic layer, and a fourth inorganic layer, sequentially from the bottom.

A halogenated metal layer including lithium fluoride (LiF) may be included between the OLED and the first inorganic layer.

The halogenated metal layer may prevent the OLED from being damaged when the first inorganic layer is formed by a sputtering method or a plasma deposition method.

The first organic layer may be formed to have a smaller area than that of the second inorganic layer, and the second organic layer may be formed to have a smaller area than that the third inorganic layer. Further, the first organic layer may be formed to be entirely covered by the second inorganic layer, and the second organic layer may be formed to be entirely covered by the third inorganic layer.

Next, a first protection film 103 is adhered to the TFE layer using a first adhesive 102 (S102). More specifically, the first protection film 103 is attached to the TFE layer of the display panel 101 by the first adhesive 102, with a configuration in which the first protection film 103 is arranged on the TFE layer of the display panel 101, and the first adhesive 102 is disposed between the TFE layer and the first protection film 103. The first adhesive 102 may be made of a silicone material, and the first adhesive 102 may have a thickness in a range of about 70 to 80 µm.

Next, a second protection film 105 is prepared and heated (S103), and is pressed and attached to the flexible substrate by using a second adhesive 104. Second protection film 105 is disposed opposite to the flexible substrate (S104). Specifically, the second protection film 105 is attached to the flexible substrate of the display panel 101 through the second adhesive 104, with a configuration in which the second protection film 105 is arranged on the opposite side of the display panel 101 from the TFE layer, and the second adhesive 104 is disposed between the flexible substrate of the display panel 101 and the second protection film 105.

During the second protection film heating step S103, the second protection film 105 may be mounted on a second protection film stage 120. Heat may be applied to the second protection film 105 by roller R or the second protection film stage 120. The second protection film stage 120 may serve as a panel on which the second protection film 105 is temporarily mounted. A side of the second protection film stage 120 may be pressed by the roller R to be relatively moved and separated from second protection film 105 and is removed. The roller R may have a cylindrical shape rotating around a fixed axis, and the surface of the roller R may be heated by heat transferred from a heat-transfer unit (not shown). The second protection film 105 may be heated by coming into contact with the heated roller R. Elongation of the second adhesive 104 formed on the second protection film 105 occurs as the second protection film 105 is heated. Elongation means a rate of extension of a material. In this case, as the second protection film 105 is heated, the rate of extension of the second adhesive 104 may be increased. Alternatively, an entire part of the second protection film 105 mounted on the second protection film stage 120 may be uniformly heated by heating the second protection film stage 120 instead of heating and using the roller R. In still another embodiment, both of the roller R and the second protection film stage 120 may be heated.

Heat in a temperature range of about 50 to 130° C. may be applied to the roller R and/or the second protection film stage 120 according to the method described above.

An OLED display manufactured according to the manufacturing method shown in FIG. 1 is shown in FIG. 2E. Referring to FIG. 2E, the first adhesive 102 may have a thickness in a range of about 70 to 80 μm, and the second adhesive 104 may have a thickness in a range of about 20 to 30 μm. Further, the first adhesive 102 and the second adhesive 104 may have different elongation rates. The first adhesive 102 may be made of, for example, a silicone material, while the second adhesive 104 may be made of, for example, an acryl material.

Each of the first protection film 103 and the second protection film 105 may have a thickness in a range of about 70 to 80 μm. Further, the first protection film 103 and the second protection film 105 may have the same physical properties, and each may be formed of a flexible plastic material.

Figure 3:
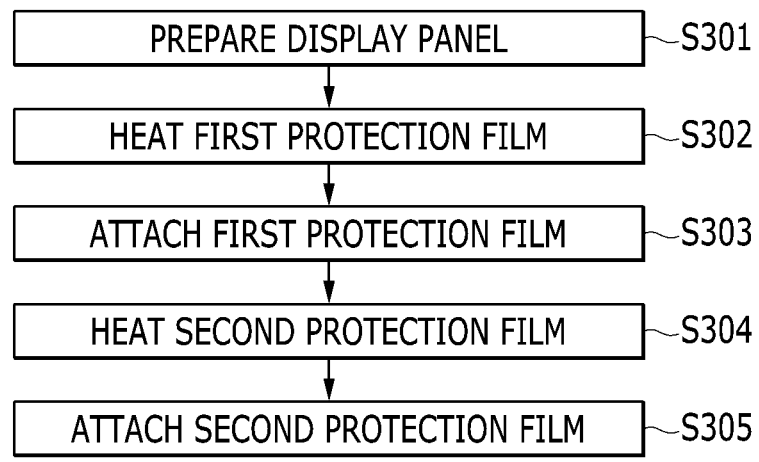
FIG. 3 is a flowchart showing a manufacturing method of an OLED display in accordance with a second exemplary embodiment.

FIG. 3 is a flowchart showing a manufacturing method of an OLED display in accordance with a second exemplary embodiment, and FIG. 4A to FIG. 4D are stepwise cross-sectional views schematically showing the manufacturing method of the second exemplary embodiment.

Figure 4A:
FIG. 4A to FIG. 4D are stepwise cross-sectional views schematically showing the manufacturing method of FIG. 3.
Figure 4B:
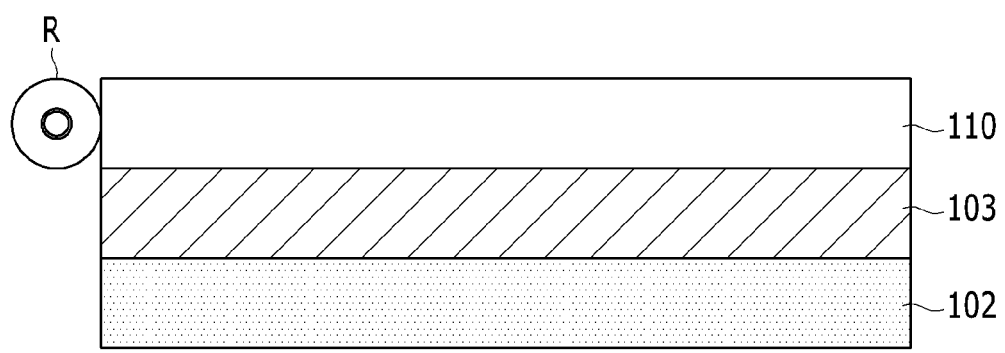
Figure 4C:
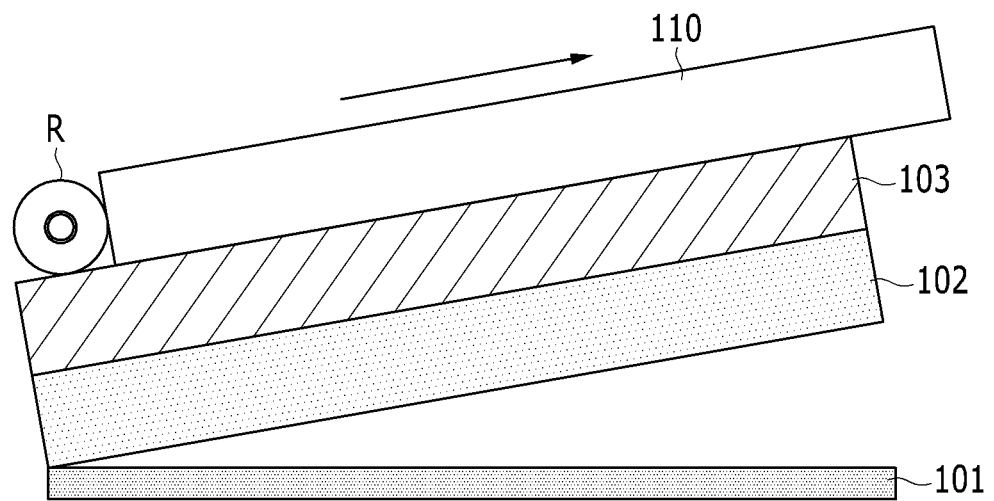
Figure 4D:
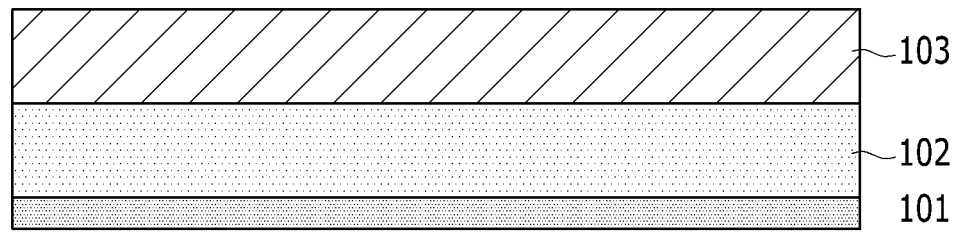

Referring to FIG. 3 to FIG. 4D, a display panel preparation step S301, a second protection film heating step S304, and a second protection film attaching step S305 in the second exemplary embodiment are the same as the corresponding steps in the manufacturing method of the first exemplary embodiment, and a redundant description thereof will be omitted.

After the display panel preparing step S301, a first protection film 103 is prepared and heated (S302), and the first protection film 103 is attached to the TFE layer by using the first adhesive 102 (S303). Specifically, the first protection film 103 is attached to the TFE layer of the display panel 101 by the first adhesive 102, with a configuration in which the first protection film 103 is arranged on the TFE layer of the display panel 101 with the first adhesive 102 being disposed between the TFE layer and the first protection film 103.

The first protection film heating step S302 and the first protection film attaching step S303 may use the same method as that of the second protection film heating step S103 and the second protection film attaching step S104 in accordance with the first exemplary embodiment. Specifically, the first protection film 103 may be mounted on a first protection film stage 110, and then the roller R and/or the first protection film stage 110 may be heated to transfer heat to the first protection film 103. The surface of the roller R may be heated by heat transferred from a heat-transfer unit (not shown). Thus, the first protection film 103 may be heated while coming into contact with the heated roller R. Alternatively, an entire part of the first protection film 103 mounted on the first protection film stage 110 may be uniformly heated by heating the first protection film stage 110 instead of heating the roller R. In still another embodiment, both of the roller R and the first protection film stage 110 may be heated.

The heat applied to the roller R and/or the first protection film stage 110 may be in a temperature range of about 50 to 130° C.

Figure 5:
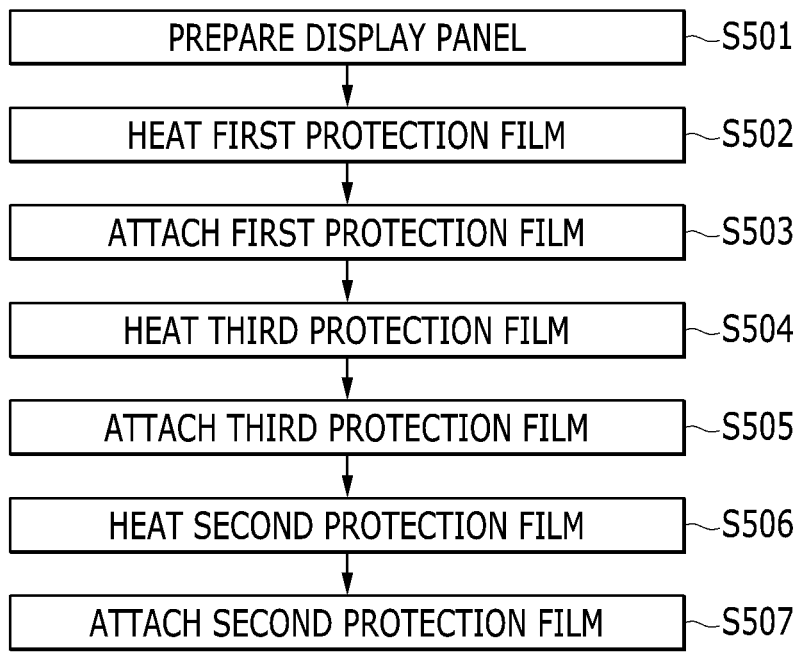
FIG. 5 is a flowchart showing a manufacturing method of an OLED display in accordance with a third exemplary embodiment.
Figure 6A:
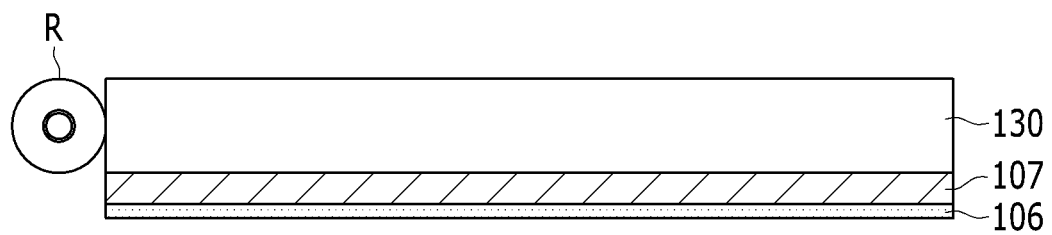
FIG. 6A and FIG. 6B are stepwise cross-sectional views schematically showing the manufacturing method of FIG. 5.
Figure 6B:
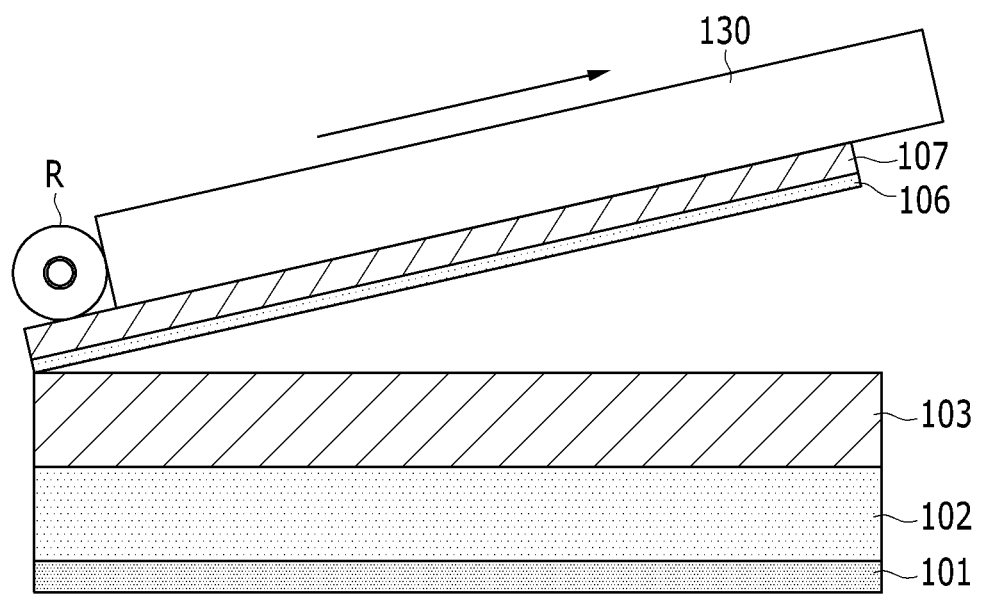

FIG. 5 is a flowchart showing a manufacturing method of an OLED display in accordance with a third exemplary embodiment, and FIG. 6A and FIG. 6B are stepwise cross-sectional views schematically showing the manufacturing method of the third exemplary embodiment.

Referring to FIG. 5 to FIG. 6B, a manufacturing method of an OLED display in accordance with the third exemplary embodiment is the same as the manufacturing method of the aforementioned second exemplary embodiment except that the manufacturing method of the third exemplary embodiment further includes a step S504 in which a third protection film is prepared and heated and a third protection film attaching step S505 after a first protection film attaching step S503. A redundant description of features identical to the second exemplary embodiment will be omitted.

After display panel preparing step S501, a first protection film 103 is prepared, heated (S502), and attached to the TFE layer by using the first adhesive 102 (S503).

Next, a third protection film 107 is prepared and heated (S504) and pressed and attached to the first protection film 103 by using a third adhesive 106. The third adhesive 106 is disposed on the opposite side of the first protection film 103 from the first adhesive 102 (S505).

In this case, the third protection film heating step S505 may use the same method as that of the first protection film heating step S302 and the second protection film heating step S304. Specifically, the third protection film 107 may be mounted on a third protection film stage 130, and then the roller R and/or the third protection film stage 130 is heated to transfer heat to the third protection film 107. Alternatively, an entire part of the third protection film 107 mounted on the third protection film stage 130 may be uniformly heated by heating the third protection film stage 130 instead of heating the roller R. In another embodiment, both of the roller R and the third protection film stage 130 may be heated.

Heat in a temperature range of about 50 to 130° C. may be applied to the roller R and/or the third protection film stage 130.

Figure 7:
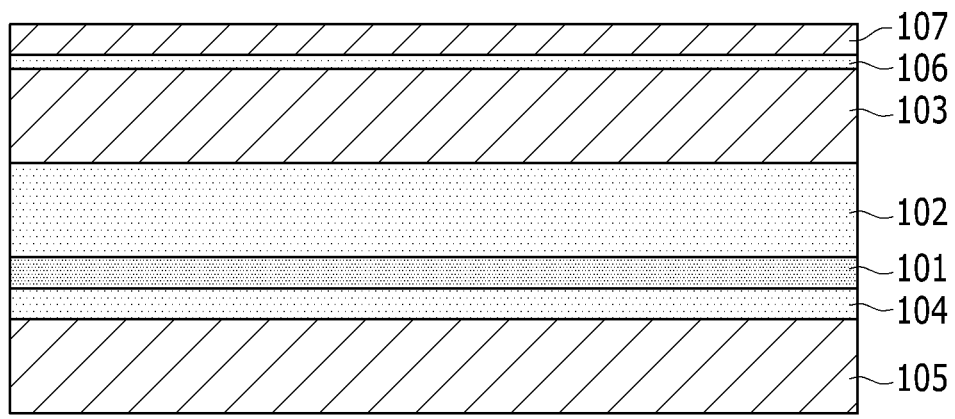
FIG. 7 is a cross-sectional view showing an OLED display manufactured according to the manufacturing method of FIG. 5.

FIG. 7 is a cross-sectional view showing an OLED display manufactured according to the manufacturing method of the third exemplary embodiment.

Referring to FIG. 7, the OLED display in which the first to third protection films 103, 105, and 107 are attached to the display panel 101 using the first to third adhesives 102, 104, and 106, respectively, is shown. The third adhesive 106 may have a thickness in a range of about 5 to 15 μm, and the second adhesive 104 and the third adhesive 106 may have different elongation rates. The third adhesive 106 may be made of a silicone material identical to the first adhesive 102.

The third protection film 107 may have a thickness in a range of about 20 to 30 μm. Further, the first protection film 103 to the third protection film 107 may have the same physical properties to improve a mechanical strength and prevent damage. Each of the first protection film 103 to the third protection film 107 may be formed of a plastic material and have a flexibility similar to the flexible substrate of the plastic material. Each of the first protection film 103 to the third protection film 107 may be a typical film made of, for example, polyethylene (PE), polycarbonate (PC), polyethylene terephthalate (PET), urethane, or polyethylene naphthalate (PEN). Other than the above, various kinds of films may also be used.

Figure 8:
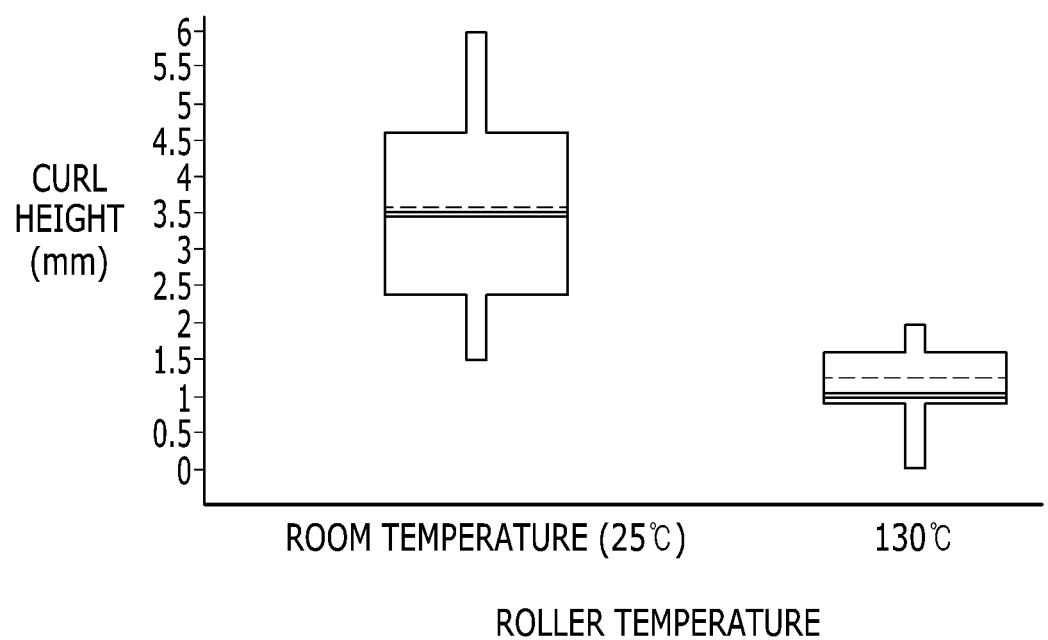
FIG. 8 is a graph showing curling improvement when a second protection film is heated and attached to a display panel according to the manufacturing method of FIG. 1.

FIG. 8 is a graph showing curling improvement when a second protection film is heated and attached to a display panel according to the manufacturing method of the first exemplary embodiment.

FIG. 8 demonstrates that, when no heat is applied to the second protection film 105 (room temperature of 25° C.), curling of the display panel 101 occurs in a range of about 1.5 to about 6 mm in the OLED display manufactured according to the manufacturing method of the first exemplary embodiment. In contrast, when heat of a temperature of about 130° C. is applied to the second protection film 105 by using the roller R, the curling of the display panel 101 is formed in a range of about 0 to about 2 mm. As shown in FIG. 8, curling of the display panel 101 when heat of a temperature of about 25° C. is applied occurs in a generally larger range than that when heat of a temperature of about 130° C. As a result, as shown in FIG. 8, the curling of the display panel 101 is reduced by applying heat to the second protection film 105. It is also possible to similarly adjust elongations of the upper adhesive and the lower adhesive with respect to the display panel 101 by applying heat of a controlled temperature to the first protection film 103, the second protection film 105, and the third protection film 107, thereby reducing the curling of the display panel.

Vacuum adsorption, align key recognition, transport, loading, and various other subsequent processes may more easily be performed when curling of the display panel 101 is reduced.

A difference between elongation rates of the upper adhesive and the lower adhesive with respect to the display panel can be reduced by heating the first to third protection films. The first to third protection films are attached to the display panel according to the manufacturing method of the OLED display in accordance with the exemplary embodiments, thereby improving the display device.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A manufacturing method of an organic light emitting diode (OLED) display, the manufacturing method comprising:
    adhering a first protection film to a thin film encapsulation (TFE) layer of an organic light emitting device using a first adhesive,
    heating a second protection film;
    heating a third protection film after heating the first protection film;
    adhering the second protection film to a flexible substrate of the organic light emitting device using a second adhesive after the heating of the second protection film; and
    adhering the third protection film to the first protection film by using a third adhesive after heating the first protection film, the third protection film being disposed opposite the first protection film.

2. The manufacturing method of claim 1, wherein heating the third protection film comprises:
    mounting the third protection film on a third protection film stage and then heating at least one of a roller and the third protection film stage to transfer heat to the third protection film.

3. The manufacturing method of claim 2, wherein adhering the third protection film comprises pressing and attaching the third protection film to the flexible substrate by pressing one side of both the third protection film and the third protection film stage, and moving the third protection film stage in one direction.

4. The manufacturing method of claim 2, wherein heating of the third protection film further comprises applying heat in a temperature range of about 50° C. to 130° C. to at least one of the roller and the third protection film stage.

5. The manufacturing method of claim 1, wherein the first adhesive has a thickness in a range of 70 to 80 μm, and the second adhesive has a thickness in a range of 20 to 30 μm.

6. The manufacturing method of claim 1, wherein the first adhesive and the second adhesive have different elongation rates.

7. The manufacturing method of claim 1, wherein the first adhesive comprises a silicone material.

8. The manufacturing method of claim 1, wherein the second adhesive comprises an acryl material.

9. The manufacturing method of claim 1, wherein each of the first protection film and the second protection film has a thickness in a range of 70 to 80 μm.

10. The manufacturing method of claim 1, wherein the first protection film, the second protection film, and the third protection film each comprise a flexible plastic material.

11. The manufacturing method of claim 1, wherein the third protection film has a thickness in a range of 20 to 30 μm.

12. The manufacturing method of claim 1, wherein the third adhesive has a thickness in a range of 5 to 15 μm.

* * * * *